United States Patent
Yoshida

(10) Patent No.: US 8,698,062 B2
(45) Date of Patent: Apr. 15, 2014

(54) A/D CONVERTER, SOLID-STATE IMAGE SENSOR USING PLURALITY OF A/D CONVERTERS AND DRIVING METHOD OF A/D CONVERTER FOR CORRECTING AN OFFSET VALUE OF THE A/D CONVERTER BASED ON A HELD OFFSET VALUE

(75) Inventor: Daisuke Yoshida, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 267 days.

(21) Appl. No.: 13/114,164

(22) Filed: May 24, 2011

(65) Prior Publication Data

US 2011/0309235 A1 Dec. 22, 2011

(30) Foreign Application Priority Data

Jun. 18, 2010 (JP) ................................. 2010-139946

(51) Int. Cl.
  *H01L 27/00* (2006.01)
  *H03M 1/06* (2006.01)
  *H03M 1/12* (2006.01)

(52) U.S. Cl.
  USPC ......... 250/208.1; 341/118; 341/155; 341/169

(58) Field of Classification Search
  CPC  H03M 1/0607; H03M 1/1023; H03M 1/1295
  USPC ......... 250/208.1, 214 DC; 341/155–169, 118
  See application file for complete search history.

(56) References Cited

U.S. PATENT DOCUMENTS

| | | | |
|---|---|---|---|
| 7,145,494 B2 * | 12/2006 | Mizuguchi et al. | ........... 341/155 |
| 7,586,431 B2 | 9/2009 | Muramatsu et al. | |
| 7,633,539 B2 | 12/2009 | Yamashita | |
| 8,208,055 B2 | 6/2012 | Hiyama | |
| 2012/0112947 A1 * | 5/2012 | Krauss et al. | ................. 341/172 |

FOREIGN PATENT DOCUMENTS

| | | |
|---|---|---|
| CN | 1681211 A | 10/2005 |
| CN | 1716773 A | 1/2006 |
| JP | 2005-323331 A | 11/2005 |
| JP | 2006-020171 A | 1/2006 |
| WO | 2009/119270 A1 | 10/2009 |

OTHER PUBLICATIONS

Office Action mailed Jun. 19, 2013, in Chinese Patent Application No. 201110162682.2, State Intellectual Property Office of the People's Republic of China.

* cited by examiner

*Primary Examiner* — Thanh Luu
(74) *Attorney, Agent, or Firm* — Fitzpatrick, Cella, Harper & Scinto

(57) ABSTRACT

An analog-to-digital converter converts an analog signal into a digital signal by measuring a time period until a magnitude relation between a voltage level of a reference signal that changes along with time and a voltage level of the analog signal is inverted. The converter comprises a holding unit which holds, as a voltage level that is an analog value, an offset value of the analog-to-digital converter upon analog-to-digital converting a reference voltage level by the analog-to-digital converter, wherein the offset value of the analog-to-digital converter is corrected by changing the voltage level of the analog signal by the voltage level of the offset value held by the holding unit.

10 Claims, 8 Drawing Sheets

A/D CONVERTER, SOLID-STATE IMAGE SENSOR USING PLURALITY OF A/D CONVERTERS AND DRIVING METHOD OF A/D CONVERTER FOR CORRECTING AN OFFSET VALUE OF THE A/D CONVERTER BASED ON A HELD OFFSET VALUE

BACKGROUND OF THE INVENTION

1. Field of the Invention

The present invention relates to an A/D converter, a solid-state image sensor using a plurality of A/D converters and a driving method of an A/D converter. More particularly, the present invention relates to an A/D converter which performs A/D conversion by comparing a ramp reference signal, which makes a predetermined change along with time, with an analog input signal, and measuring a timing at which a comparison signal indicating the comparison result changes, a solid-state image sensor using a plurality of A/D converters and a driving method of driving the A/D converters.

2. Description of the Related Art

In recent years, a solid-state image sensor, which includes, on a single chip, a plurality of pixels each including a photoelectric conversion element and a plurality of A/D converters that convert analog signals output from the pixels into digital signals, is popularly used in digital cameras and digital video cameras. A typical solid-state image sensor includes, as principal circuitry components, a plurality of pixels, a scanning circuit for addressing, and A/D converters arranged for respective columns. Especially, a MOS solid-state image sensor has a large merit upon configuring, for example, the A/D converters and scanning circuit on a single chip.

However, in consideration of such application, since characteristic variations of individual A/D converters constitute a major cause of deterioration of image quality, a proposal for reducing the characteristic variations has been made. For example, according to Japanese Patent Laid-Open No. 2005-323331, in a solid-state image sensor which mounts A/D converters on a single chip, column A/D circuits each having a voltage comparing circuit and counter are arranged in correspondence with vertical signal lines. Each voltage comparing circuit compares a pixel analog signal input via the corresponding vertical signal line for each row control line with a ramp reference signal, and generates a pulse signal having a width in the time axis direction corresponding to the magnitudes of reset and signal components. Each counter counts clocks corresponding to the width of the pulse signal until completion of comparison of the voltage comparing circuit, and holds a count value at a comparison completion timing. A communication/timing control portion controls the voltage comparing circuit to execute comparing processing of a reset component and the counter to perform a down-count operation in a first operation, and to control the voltage comparing circuit to execute comparing processing of a signal component and the counter to perform an up-count operation in a subsequent second operation. With this operation, subtraction processing of a reference component and signal component is directly performed.

In the prior art such as Japanese Patent Laid-Open No. 2005-323331, a digital signal allows subtraction processing of a reference component and signal component, and an offset of each individual A/D converter can be reduced. However, as an analog signal, the dynamic range of each A/D converter is impaired by the magnitude of a reference component.

SUMMARY OF THE INVENTION

The present invention provides a technique advantageous in correction of an offset of each individual A/D converter without impairing the dynamic range of the A/D converter.

The first aspect of the present invention provides an analog-to-digital converter, which converts an analog signal into a digital signal by measuring a time period until a magnitude relation between a voltage level of a reference signal that changes along with time and a voltage level of the analog signal is inverted, the converter comprising a holding unit which holds, as a voltage level that is an analog value, an offset value of the analog-to-digital converter upon analog-to-digital converting a reference voltage level by the analog-to-digital converter, wherein the offset value of the analog-to-digital converter is corrected by changing the voltage level of the analog signal by the voltage level of the offset value held by the holding unit.

The second aspect of the present invention provides a solid-state image sensor configured by forming, on a single substrate, a plurality of pixels, which are arranged in an array, and a plurality of analog-to-digital converters, each of which is arranged in correspondence with one column of the plurality of pixels, each of the plurality of analog-to-digital converters including an analog-to-digital converter as defined in the first aspect of the present invention, the reference signal being connected to be commonly used by the plurality of analog-to-digital converters, and each of the plurality of analog-to-digital converters correcting an analog-to-digital conversion using an offset value independent from other analog-to-digital converters.

The third aspect of the present invention provides a driving method of an analog-to-digital converter, wherein the analog-to-digital converter comprises a holding unit for holding, as an analog value, an offset value of the analog-to-digital converter upon analog-to-digital converting a reference voltage level by the analog-to-digital converter, and wherein the driving method comprises a step for holding the offset value by the holding unit, and a step for correcting the offset value of the analog-to-digital converter by changing the voltage level of the analog signal by the offset value held by the holding unit.

According to the present invention, since an offset variation of each individual A/D converter can be corrected in an analog signal, an offset of each individual A/D converter can be corrected without impairing the dynamic range of the A/D converter.

Further features of the present invention will become apparent from the following description of exemplary embodiments (with reference to the attached drawings).

DESCRIPTION OF THE EMBODIMENTS

Exemplary Arrangement of Solid-state Image Sensor of This Embodiment

Figure 1:
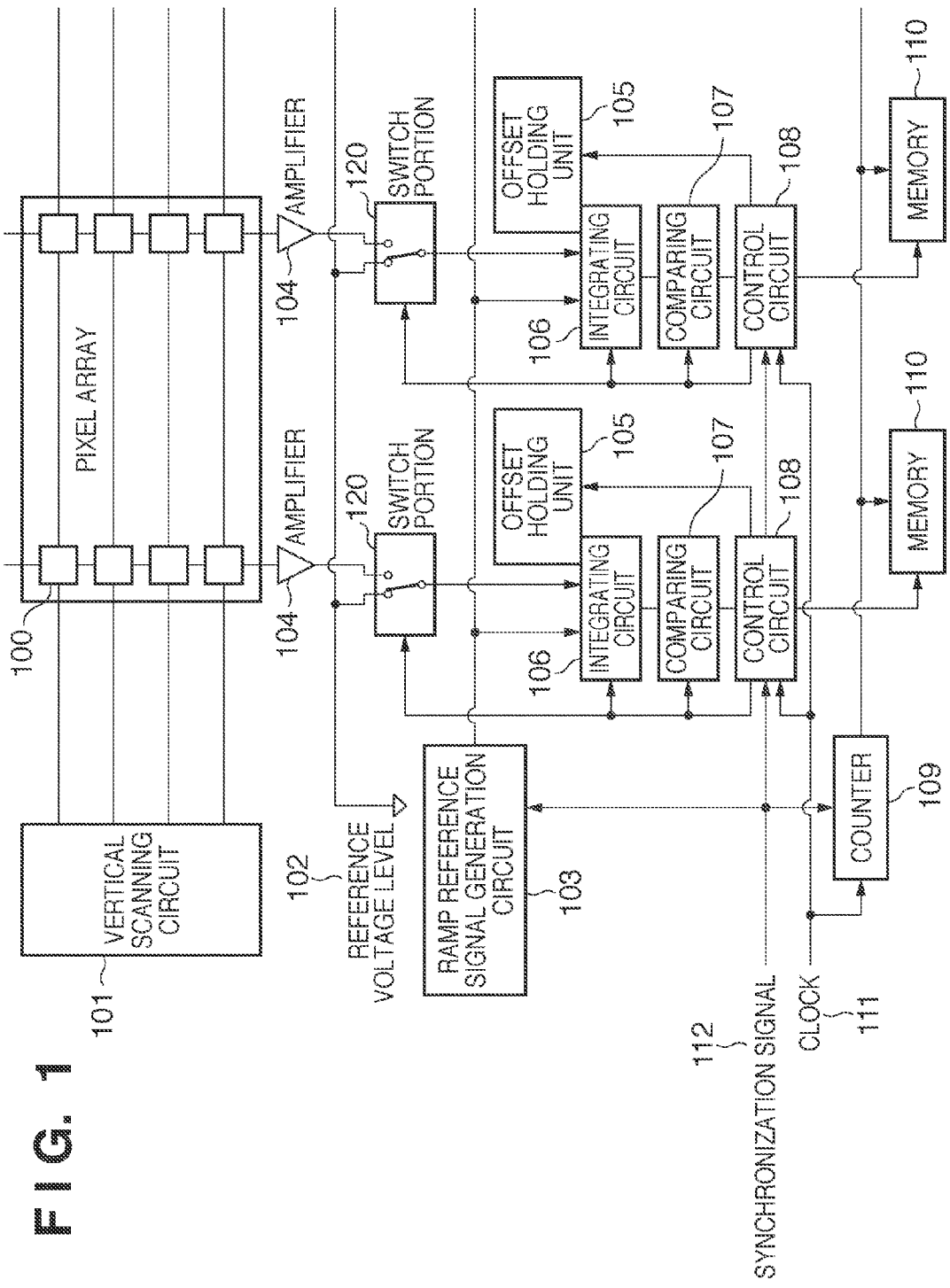
FIG. 1 is a block diagram showing an arrangement example of a solid-state image sensor using A/D converters according to the present invention.

An exemplary arrangement of a solid-state image sensor using analog-to-digital converters (to be referred to as A/D converters hereinafter) according to an embodiment of the present invention will be described below with reference to FIG. 1. Referring to FIG. 1, a pixel array is configured by two-dimensionally arranging a plurality of pixels 100 to form a plurality of rows and a plurality of columns. Each pixel 100 of the pixel array is selected by a vertical scanning circuit 101, and an image signal from a row of interest is output via an amplifier 104 arranged for each column. Integrating circuits 106 formed on the same substrate as the pixels 100 are switched by switch portions 120. After output signals of the amplifiers 104 are sampled, a ramp reference signal, which is generated by a ramp reference signal generation circuit 103, common to all columns and changes along with time, is input. A counter 109 starts a count-up operation in response to the beginning of an output of the ramp reference signal. The output of each integrating circuit 106 is compared with a reference level, which is set in advance, by a comparing circuit 107. When the magnitude relation between the output of the integrating circuit 106 and the reference level changes, the output of the comparing circuit 107 is inverted accordingly. A control circuit 108 detects an inversion timing of the output of the comparing circuit 107, and stores a counter value of the counter 109 in a memory 110 as a time measurement value at that timing. The counter value stored in the memory 110 is used as a digital signal of an A/D conversion result. In this embodiment, an A/D converter arranged for each column includes an offset holding unit 105, integrating circuit 106, comparing circuit 107, control circuit 108, and memory 110. The ramp reference signal generation circuit 103 and counter 109 are arranged in common to a plurality of A/D converters of respective columns. In this case, respective portions of each A/D converter operate in synchronism with each other based on a clock 111 and a synchronization signal 112.

Each A/D converter has an offset holding unit 105 which holds an offset value as a voltage level which is an analog value indicating the offset value. The offset holding unit 105 holds an offset value obtained when A/D conversion is executed by sampling a reference level 102 by the integrating circuit 106, as an analog value indicating the offset value. The A/D converter is configured to change an analog signal using the held analog value indicating the offset value, thereby correcting an offset value of each individual A/D converter in the next A/D conversion cycle. Note that FIG. 1 illustrates respective blocks, which are simplified to clearly express respective functions that implement each A/D converter of the present invention, and their connection relationship. However, as will be seen from respective embodiments of an A/D converter to be described hereinafter, some components are commonly used for a plurality of blocks, and the connection relationship between blocks are not simple unlike in FIG. 1. For example, in the first and third embodiments, the offset holding unit 105 is included in the integrating circuit 106. Also, not all of switches can be integrated in the switch portion 120.

Plurality of Embodiments of A/D Converter

Several embodiments of an A/D converter suited to the aforementioned offset correction of the present invention will be described hereinafter with reference to the drawings.

First Embodiment

A circuit example of an A/D converter which can perform offset correction of the first embodiment will be described first with reference to FIGS. 2 and 3.

(Circuit Example of A/D Converter of First Embodiment)

Figure 2:
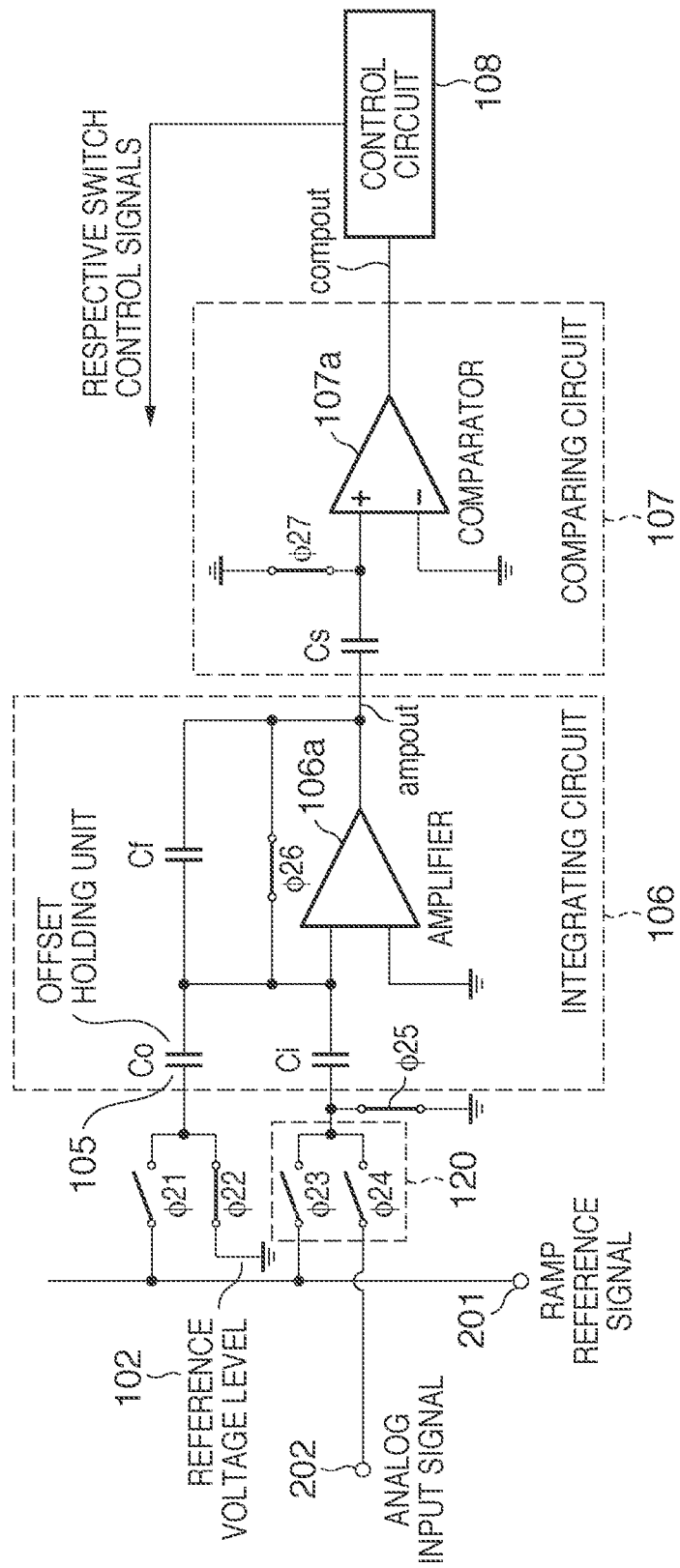
FIG. 2 is a block diagram showing a circuit arrangement example of the first embodiment of an A/D converter having an offset correction function according to the present invention.
Figure 3:
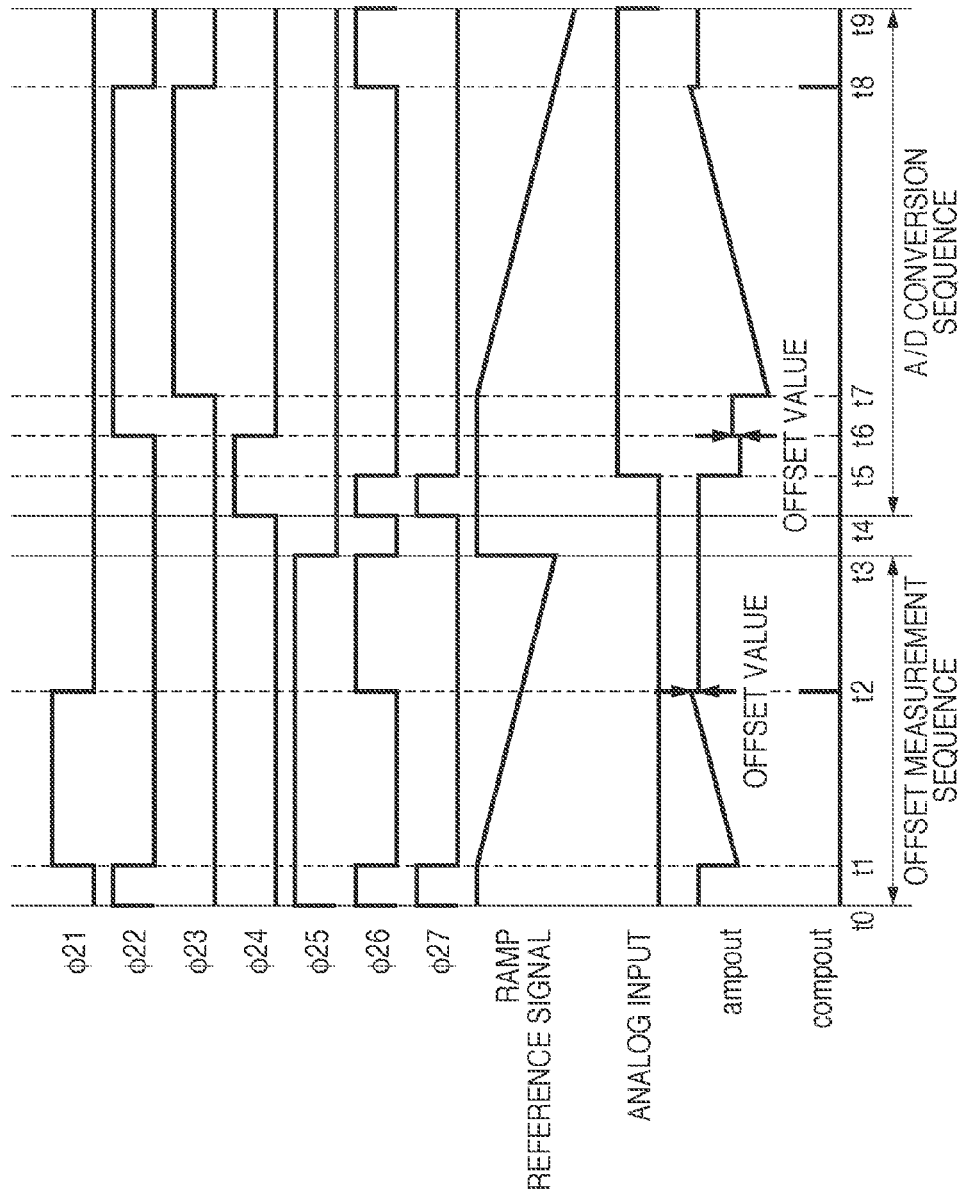
FIG. 3 is a timing chart for explaining a circuit operation example of the A/D converter shown in FIG. 2.

Referring to FIG. 2, the integrating circuit 106 of the A/D converter is configured using an amplifier 106a having a sampling capacitance (capacitor Ci) and feedback capacitance (capacitor Cf). An offset capacitance (capacitor Co) is used as the offset holding unit 105. An output node ampout of the integrating circuit 106 is connected to the comparing circuit 107 configured by a series capacitance Cs and comparator 107a. The control circuit 108 operates to have, as inputs, a value of an output node compout of the comparing circuit 107, the clock 111 and the synchronization signal 112 shown in FIG. 1. Then, by controlling switches φ21 to φ27 using respective switch control signals, a write operation of a counter value of the counter 109 in the memory 110 shown in FIG. 1 is controlled.

(Exemplary Operation of A/D Converter of First Embodiment)

An operation of the A/D converter of the first embodiment will be described below using the timing chart shown in FIG. 3. In the following description, "high level" is described as "switch on", and "low level" is described as "switch off". The operation of the A/D converter of the first embodiment has an offset measurement sequence and analog-to-digital conversion sequence to perform a single analog-to-digital conversion. In the offset measurement sequence, an offset value is held as a voltage level indicating that offset value. In the analog-to-digital conversion sequence, the analog-to-digital conversion of the analog signal is corrected using the voltage level of the offset value.

In the offset measurement sequence, at an initial phase t0, the switches φ22, φ25, φ26, and φ27 are on, and the switches φ21, φ23, and φ24 are off (the state shown in FIG. 2). In this state, the integrating circuit 106 and comparing circuit 107 are reset, and the reference level 102 is sampled in the offset capacitance Co. The output ampout of the integrating circuit 106 is a ground level. Subsequently, when the switches φ26 and φ27 are off and the switch φ21 is on at a timing t1, the integrating circuit 106 starts integration, and a ramp reference signal 201 is input to the offset capacitance Co at the same time. At this time, the output ampout of the integrating circuit 106 changes, as shown in FIG. 3. At a timing t2 at which the output ampout of the integrating circuit 106 rises, and a pulse is generated in the output compout of the comparator 107a, a voltage corresponding to an offset of the A/D converter is output as the output ampout of the integrating circuit 106. At this timing, when the switch φ21 is off and the switch φ26 is on, an offset voltage of the A/D converter is stored in the offset capacitance Co as the offset holding unit 105. As described above, the offset value measurement and holding operations in the offset measurement sequence are complete. At t3, a last timing of the offset measurement sequence, all the switches φ21 to φ27 are off to prepare for the subsequent A/D conversion sequence.

In the subsequent analog-to-digital conversion sequence (A/D conversion sequence), correction is made using the offset voltage held in the offset capacitance Co. At an initial phase t4, the switches φ24, φ26, and φ27 are on to reset the comparing circuit 107, and to sample an analog input signal 202 in the sampling capacitance Ci. At this time, the switch φ22 is kept off to maintain the offset voltage without resetting the offset capacitance Co. Next, when the switches φ26 and φ27 are off at a timing t5, the integrating circuit 106 starts an integration operation. The analog input signal 202 changes, as shown in FIG. 3, to transfer a pixel signal to the output ampout of the integrating circuit 106 via the switch φ24 and sampling capacitance Ci. After that, when the switch φ22 is on at a timing t6, the offset voltage is transferred from the offset capacitance Co to the feedback capacitance Cf. As a result of this operation, an offset-correction is performed on the output ampout of the integrating circuit 106 by the signal stored in the offset capacitance Co. Subsequently, when the switch φ23 is on and the ramp reference signal 201 begins to operate at the same time at a timing t7, the output ampout of the integrating circuit 106 changes after that timing, as shown in FIG. 3. At a timing t8 at which the output ampout of the integrating circuit 106 rises, and a pulse is generated in the output compout of the comparator 107a, a counter value of the counter 109 is written in the memory 110, thus completing the A/D conversion. At this timing, the switches φ22 and φ23 are off and the switch φ26 is on, thereby resetting the integrating circuit 106. At t9, a last timing in the A/D conversion sequence, all the switches φ21 to φ27 are off to prepare for the subsequent offset measurement sequence.

In the first embodiment, the offset measurement sequence and A/D conversion sequence are repeated. Thus, an offset value unique to each A/D converter, which is stored in the offset capacitance Co in the offset measurement sequence, is held as an analog value, and is used in the offset correction in the A/D conversion sequence. Therefore, an offset of each individual A/D converter can be corrected independent from other A/D converters without impairing the dynamic range of the A/D converter.

Second Embodiment

The second embodiment of an A/D converter which can perform offset correction according to the present invention will be described below with reference to FIGS. 4 and 5.

(Exemplary Circuit of A/D Converter of Second Embodiment)

In the second embodiment, an offset signal is held using a feedback capacitance (capacitor Cf). In many applications, A/D conversion is repetitively executed at a predetermined cycle. This embodiment uses the fact that when an output ampout of an integrating circuit 106 rises and a pulse is generated in an output compout of a comparator 107a in previous A/D conversion processing, the output ampout of the integrating circuit 106 reaches a voltage corresponding to the offset value of the A/D converter (see FIG. 3). That is, an offset value in the previous analog-to-digital conversion is held as a voltage level, and is used in the next analog-to-digital conversion. In the arrangement of the A/D converter of the second embodiment shown in FIG. 4, the circuit for storing an offset voltage in the offset capacitance Co used in the offset measurement sequence is excluded from the arrangement of the first embodiment shown in FIG. 2. Also, the switches φ21, φ22, and φ25 in FIG. 2, which are not required in this example, are omitted, and a switch φ43 is added to store and hold an offset voltage in the feedback capacitance Cf. Note that switches φ41, φ42, φ44, and φ45 in FIG. 4 have roles corresponding to the switches φ23, φ24, φ26, and φ27 in FIG. 2.

(Exemplary Operation of A/D Converter of Second Embodiment)

An operation of the A/D converter of the second embodiment will be described below using the timing chart shown in FIG. 5. At signal sampling timings t10 and t20, the switches φ42, φ44, and φ45 are on to reset the integrating circuit 106 and a comparing circuit 107, and to sample a signal in a sampling capacitance Ci. However, the switch φ43 is off not to reset the feedback capacitance Cf. At this time, the feedback capacitance Cf holds a state at the previous cycle end timing, that is, it holds a voltage corresponding to an offset value. Next, at timings t11 and t21, the switches φ44 and φ45 are off and the switch φ43 is on, thereby setting the integrating circuit 106 in an integration operation state. At the same time, when an analog input signal 202 changes, as shown in FIG. 5, a pixel signal is transferred to the output ampout of the integrating circuit 106 via the switch φ42 and the sampling capacitance Ci. Subsequently, at timings t12 and t22, when the switch φ42 is off and the switch φ41 is on to start the operation of a ramp reference voltage 201, the output ampout of the integrating circuit 106 changes, as shown in FIG. 5. Subsequently, at timings t13 and t23 at which the output ampout of the integrating circuit 106 rises, and a pulse is generated in the output compout of the comparator 107a, a counter value of the counter 109 is written in the memory 110 (not shown). At the same time, when the switch φ43 is off and the switch φ44 is on, a voltage corresponding to an offset value can be held in the feedback capacitance Cf again. By repeating the aforementioned operation, an offset of each individual A/D converter can be corrected without impairing the dynamic range of the A/D converter.

Third Embodiment

The third embodiment of an A/D converter which can perform offset correction according to the present invention will be described below with reference to FIGS. 6 and 7.

(Exemplary Circuit of A/D Converter of Third Embodiment)

Figure 4:
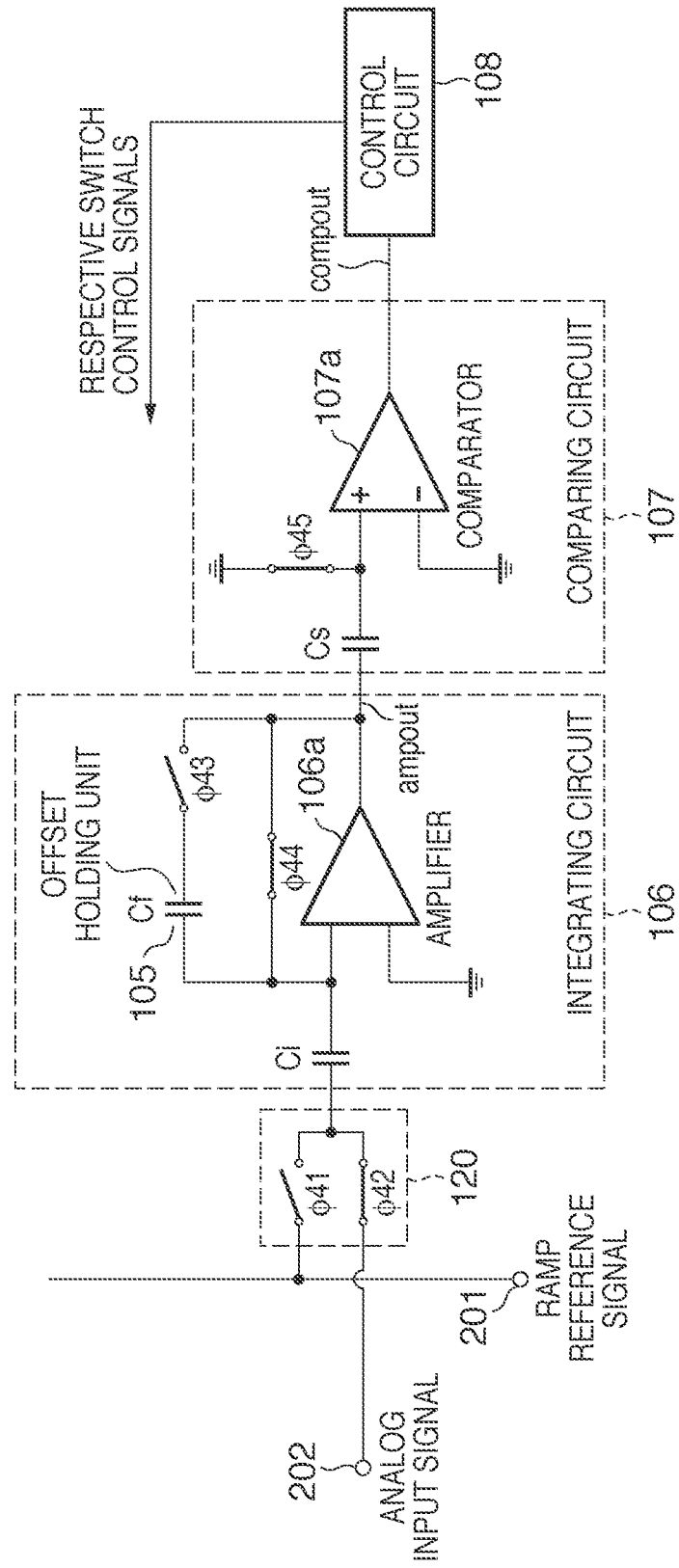
FIG. 4 is a block diagram showing a circuit arrangement example of the second embodiment of an A/D converter having an offset correction function according to the present invention.
Figure 5:
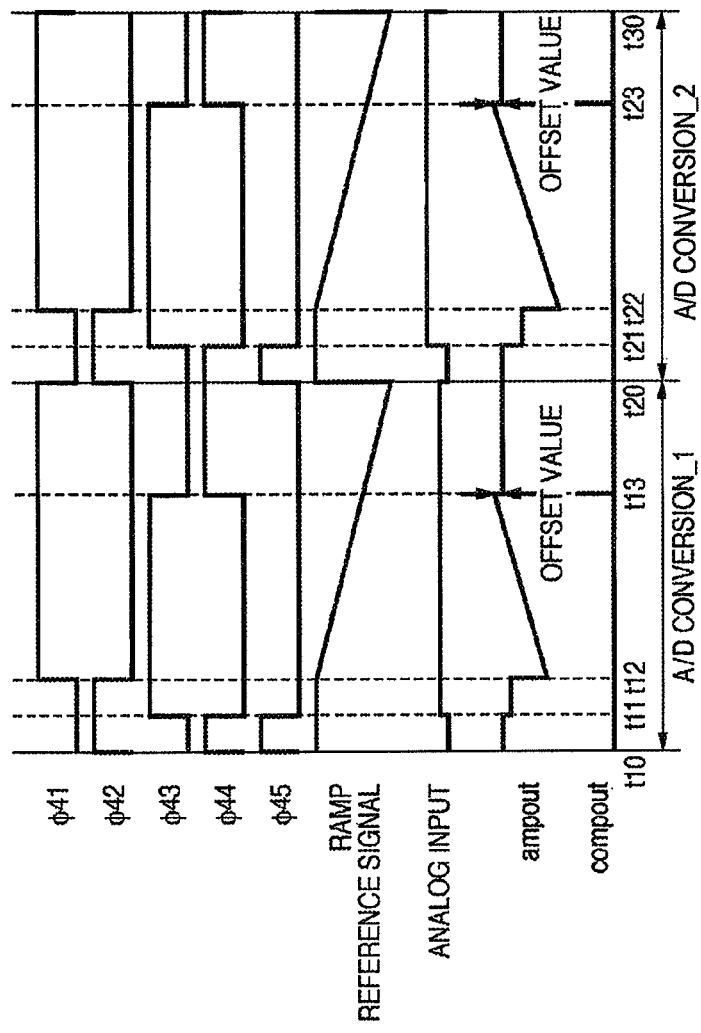
FIG. 5 is a timing chart for explaining a circuit operation example of the A/D converter shown in FIG. 4.
Figure 6:
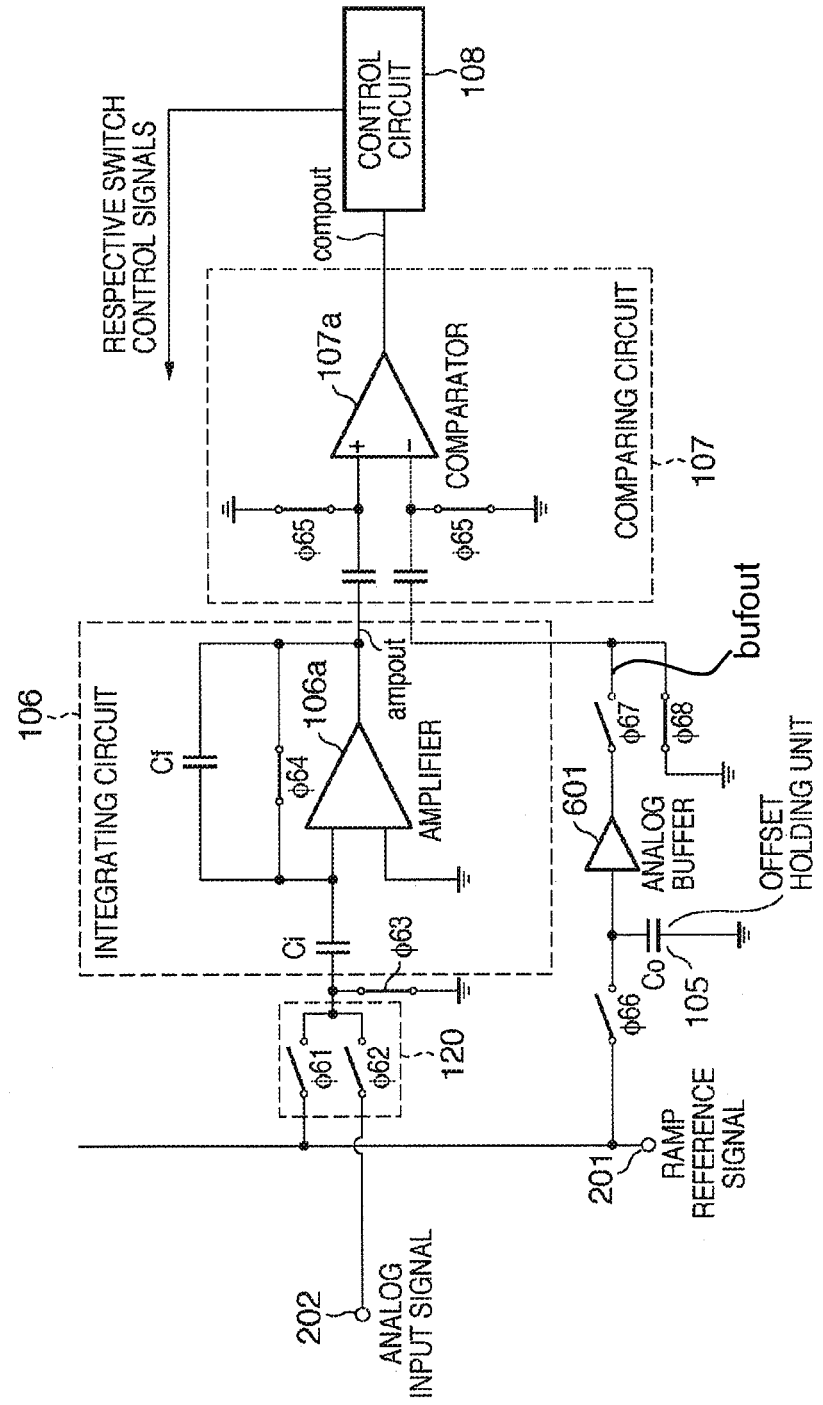
FIG. 6 is a block diagram showing a circuit arrangement example of the third embodiment of an A/D converter having an offset correction function according to the present invention.

In the arrangement of the A/D converter of the third embodiment shown in FIG. 6, an offset holding unit 105 is arranged independently of an integrating circuit 106 without holding an offset value in a feedback capacitance Cf, in the arrangement of the second embodiment shown in FIG. 4. The switch φ43 in FIG. 4, which is not required in this embodiment, is omitted, and the offset holding unit 105 including an offset capacitance Co, analog buffer 601, and switches φ66, φ67, and φ68 is arranged, so as to store and hold an offset voltage. An output bufout of the offset holding unit 105, which is driven by the analog buffer 601 of the offset holding unit 105 is connected to a minus (−) terminal of a comparator 107a in a comparing circuit 107. Note that in FIG. 6, the analog buffer 601 can be configured by a source-follower circuit or a voltage-follower circuit using an operational amplifier. Note that switches φ61, φ62, φ64, and φ65 in FIG. 6 have roles corresponding to the switches φ41, φ42, φ44, and φ45 in FIG. 4, and a switch φ63 in FIG. 6 has a role corresponding to the switch φ25 in FIG. 2.

(Exemplary Operation of A/D Converter of Third Embodiment)

An operation of the A/D converter of the third embodiment will be described below using the timing chart shown in FIG.

7. The A/D converter of the third embodiment has an offset measurement sequence and analog-to-digital conversion sequence so as to perform a single analog-to-digital conversion, as in the first embodiment.

Figure 7:
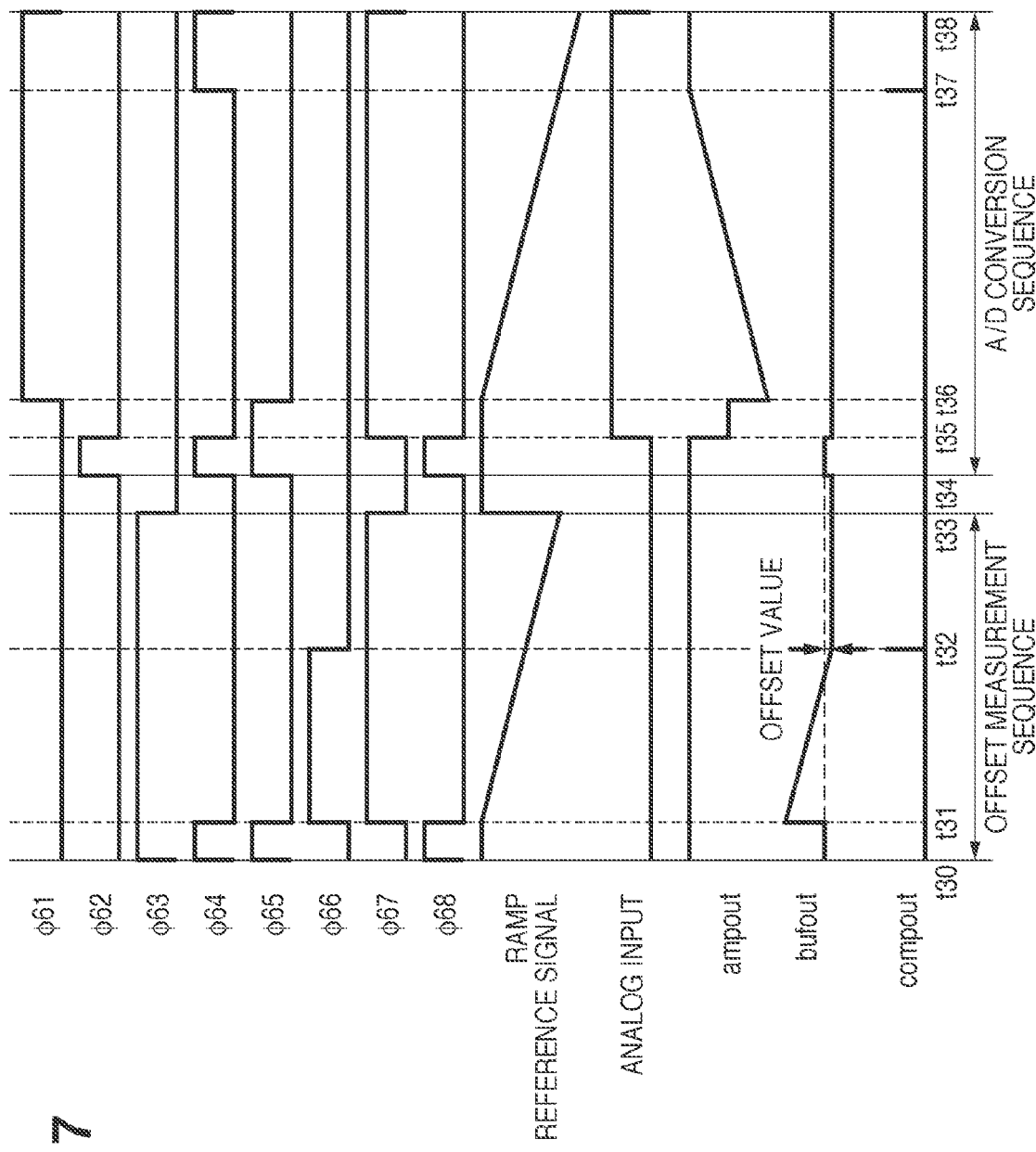
FIG. 7 is a timing chart for explaining a circuit operation example of the A/D converter shown in FIG. 6.

In the offset measurement sequence in FIG. 7, at an initial phase t30, the switches φ63, φ64, φ65, and φ68 are on to reset the integrating circuit 106 and comparing circuit 107. Next, at a timing t31, the switches φ66 and φ67 are on, and the switch φ68 is off. Thus, the integrating circuit 106 is set in an integration operation state, a ramp reference signal 201 is input to the input of the analog buffer 601, and its output bufout is input to the "−" terminal of the comparator 107a in the comparing circuit 107. In this case, the ramp reference signal 201 begins to operate at the same time. As a result, the output bufout of the analog buffer 601 changes, as shown in FIG. 7. At a timing t32 at which an output ampout of the integrating circuit 106 rises, and a pulse is generated in an output compout of the comparator 107a, the switch φ66 is off to store a voltage corresponding to an offset value in the offset capacitance Co as the offset holding unit 105. At t33, a last timing in the offset measurement sequence, all the switches φ61 to φ68 are off to prepare for the subsequent A/D conversion sequence.

In the subsequent A/D conversion sequence, the switches φ62, φ64, φ65, and φ68 are on at a timing t34 to reset the comparing circuit 107 and to sample a signal in the sampling capacitance Ci. After that, when the switch φ68 is off and the switch φ67 is on at a timing t35, an offset correction signal is output as the output bufout of the analog buffer 601. At the same time, the switches φ64 and φ65 are off to set the integrating circuit 106 in an integration state. Then, when an analog input signal 202 changes, as shown in FIG. 7, a pixel signal is transferred to a "+" terminal of the comparator 107a of the comparing circuit 107 via the sampling capacitance Ci and an amplifier 106a. Furthermore, when the switch φ62 is off and the switch φ61 is on at a timing t36, and an operation of the ramp reference signal 201 is started at the same time, the output ampout of the integrating circuit 106 changes, as shown in FIG. 7. At a timing t37 at which the output ampout of the integrating circuit 106 rises, and a pulse is generated in the compout of the comparator 107a, a counter value of the counter 109 is written in the memory 110, thus completing the A/D conversion operation. At t38, a last timing in the A/D conversion sequence, all the switches φ61 to φ68 are off to prepare for the subsequent offset measurement sequence. Since the comparing circuit 107 can make a comparison with an offset correction signal at the time of A/D conversion, an offset of each individual A/D converter can be corrected without impairing the dynamic range of the A/D converter. Note that an offset of the analog buffer 601 is also corrected together.

Another Exemplary Arrangement Of Solid-State Image Sensor of this Embodiment

Figure 8:
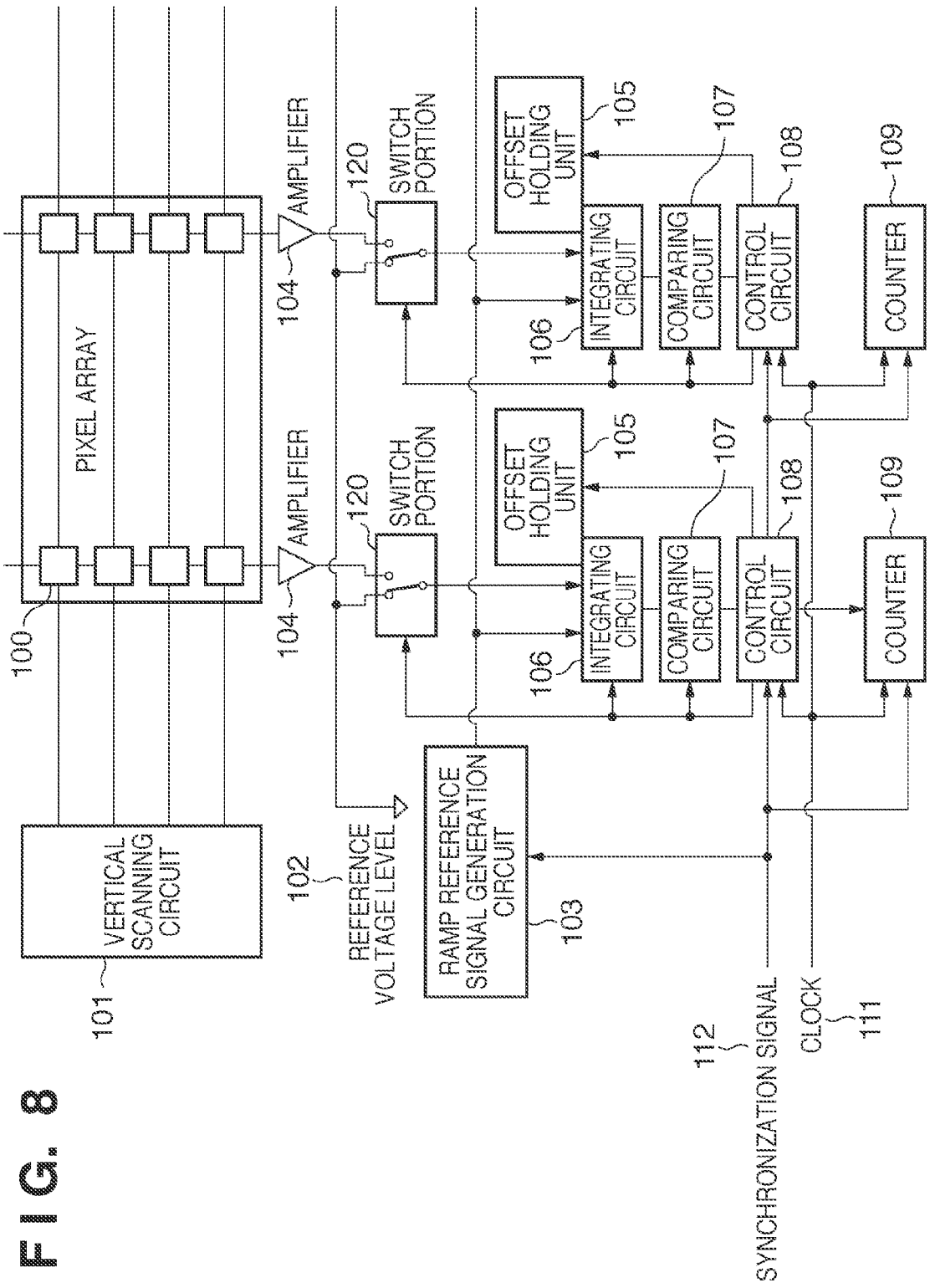
FIG. 8 is a block diagram showing another arrangement example of a solid-state image sensor using A/D converters according to the present invention.

FIG. 8 is a block diagram showing another arrangement example of a solid-state image sensor using A/D converters according to the present invention. In the arrangement example described using FIG. 1, one counter 109 required to measure a time is arranged commonly to all the columns. However, in this arrangement example, counters 109 are arranged for respective columns. In this exemplary arrangement, all the counters 109 arranged for respective columns start counting at the same time. In respective columns, outputs of comparing circuits 107 are inverted at different timings according to input signals. Each control circuit 108 stops the count operation of the counter 109 of the column of interest at that timing. As described above, the A/D conversion operation can be performed. Other components are the same as those in the arrangement example of FIG. 1, and a repetitive description thereof will be avoided. Other components can be changed to equivalent ones.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-139946, filed Jun. 18, 2010 which is hereby incorporated by reference herein in its entirety.

What is claimed is:

1. An analog-to-digital converter comprising:
an amplifier circuit configured to amplify a difference between an analog signal and a ramp reference signal; and
a comparator configured to compare an output of the amplifier circuit and a reference level, the analog-to-digital converter being configured to convert the analog signal into a digital signal based on a time period until a magnitude relation between the output of the amplifier circuit and the reference level is inverted,
wherein the amplifier circuit includes a capacitor configured to hold an offset voltage of the amplifier circuit in response to inversion of the magnitude relation, and the amplifier circuit is configured to correct the offset voltage of the amplifier circuit using the offset voltage held by the capacitor, upon analog-to-digital converting the analog signal into a digital signal.

2. The analog-to-digital converter according to claim 1, wherein the amplifier circuit includes: an amplifier having a first input terminal, a second input terminal, and an output terminal; a feedback capacitor connected between the first input terminal and the output terminal; and a sampling capacitor having one terminal connected to the first input terminal, and
wherein one terminal of the capacitor is connected to the first input terminal, and the reference level is supplied to the second input terminal.

3. The analog-to-digital converter according to claim 2, wherein, in an offset measurement sequence,
the reference level is supplied to the other terminal of the capacitor, and the ramp reference signal is supplied to the other terminal of the sampling capacitor, then
in response to the inversion of the magnitude relation, the other terminal of the capacitor is set to a floating state, and the first input terminal and the output terminal are connected with each other so that the capacitor holds the offset voltage.

4. The analog-to-digital converter according to claim 3, wherein, in an analog-to-digital conversion sequence,
the analog signal is supplied to the other terminal of the sampling capacitor, and the reference level is supplied to the other terminal of the capacitor, and thereafter
supplying the ramp reference signal to the other terminal of the sampling capacitor is started so that the analog signal is converted into a digital signal while correcting the offset voltage of the amplifier circuit based on the offset voltage held by the capacitor.

5. The analog-to-digital converter according to claim 1, wherein the amplifier circuit includes: an amplifier having a first input terminal, a second input terminal, and an output terminal; a sampling capacitor whose one terminal is connected to the first terminal; and a first switch arranged between the first input terminal and the output terminal, and wherein the capacitor is arranged, in series with a second switch, between the first input terminal and the output terminal, and the reference level is supplied to the second terminal.

6. The analog-to-digital converter according to claim 5, wherein the analog signal is supplied to the other terminal of the sampling capacitor in a state where the first switch is opened and the second switch is closed, and thereafter supplying the ramp reference signal to the other terminal of the sampling capacitor is started, and thereafter the analog signal is converted into a digital signal in response to the inversion of the magnitude relation, and the first switch is closed and the second switch is opened so that the capacitor holds the offset voltage in response to the inversion of the magnitude relation.

7. A solid-state image sensor configured by forming, on a single substrate, a plurality of pixels arranged in an array, and a plurality of analog-to-digital converters, each arranged in correspondence with one column of the plurality of pixels, wherein each of the plurality of analog-to-digital converters is an analog-to-digital converter according to claim 1.

8. An analog-to-digital converter comprising:

an amplifier circuit configured to amplify a difference between an analog signal and a ramp reference signal;

a comparator configured to compare a first signal that is an output of the amplifier circuit and a second signal, the analog-to-digital converter being configured to convert the analog signal into a digital signal based on a time period until a magnitude relation between the first signal and the second signal is inverted, an analog buffer configured to output the second signal;

a switch having one terminal connected to an input terminal of the analog buffer; and a capacitor arranged between the input terminal of the analog buffer and a reference level and configured to hold an offset voltage of the amplifier circuit, wherein the amplifier circuit includes: an amplifier having a first input terminal, a second input terminal, and an output terminal; a sampling capacitor having one terminal connected to the first input terminal; and a feedback capacitor connected between the first input terminal and the output terminal, wherein, in an offset measurement sequence, supplying of the ramp reference signal to the input terminal of the analog buffer via the switch is started in a state where the sampling capacitor is reset, thereafter the switch is opened so that the capacitor holds the offset voltage in response to inversion of the magnitude relation.

9. The analog-to-digital converter according to claim 8, wherein, in an analog-to-digital conversion sequence, the analog signal is supplied to the other terminal of the sampling capacitor, and thereafter supplying of the ramp reference signal to the other terminal of the sampling capacitor is started in a state where the switch is opened.

10. A solid-state image sensor configured by forming, on a single substrate, a plurality of pixels arranged in an array, and a plurality of analog-to-digital converters, each arranged in correspondence with one column of the plurality of pixels, wherein each of the plurality of analog-to-digital converters is an analog-to-digital converter according to claim 8.

* * * * *